(12) United States Patent
Gonya, Sr.

(10) Patent No.: US 6,868,262 B2
(45) Date of Patent: Mar. 15, 2005

(54) CONSTANT IMPEDANCE IN CMOS INPUT AND OUTPUT GAIN STAGES FOR A WIRELESS TRANSCEIVER

(75) Inventor: Dennis H. Gonya, Sr., Jamul, CA (US)

(73) Assignee: International Business Machines Corporation, Armonk, NY (US)

( * ) Notice: Subject to any disclaimer, the term of this patent is extended or adjusted under 35 U.S.C. 154(b) by 565 days.

(21) Appl. No.: 09/944,656

(22) Filed: Aug. 31, 2001

(65) Prior Publication Data

US 2003/0045258 A1 Mar. 6, 2003

(51) Int. Cl.$^7$ ................................................. H04B 1/06
(52) U.S. Cl. ..................... 455/234.1; 330/254; 330/278
(58) Field of Search ................................ 455/136, 138, 455/232.1, 234.1, 248.1, 249.1

(56) References Cited

U.S. PATENT DOCUMENTS

| | | | |
|---|---|---|---|
| 3,886,380 A | 5/1975 | Sobajima et al. | |
| 4,495,648 A | 1/1985 | Giger | |
| 4,602,215 A | 7/1986 | Ryaboshtan et al. | |
| 6,069,526 A | 5/2000 | Ballantyne | |
| 6,215,989 B1 | * 4/2001 | Otaka | ...................... 455/234.1 |
| 6,721,368 B1 | * 4/2004 | Younis et al. | ................ 375/295 |
| 6,744,317 B2 | * 6/2004 | Kim et al. | ................... 330/151 |

* cited by examiner

*Primary Examiner*—Creighton Smith
(74) *Attorney, Agent, or Firm*—Blakely, Sokoloff, Taylor & Zafman LLP

(57) ABSTRACT

An apparatus to provide a stage in a transmitter or receiver operating in wireless frequency ranges performing a gain control function between a final or an initial stage respectively and process circuitry for adjusting gain and providing a constant input impedance at its input and a constant output impedance at its output, providing a direct conversion transceiver in which constant impedance gain control circuits are provided in the receive and transmit paths, all of which are simple in construction and efficient in operation.

11 Claims, 3 Drawing Sheets

CONSTANT IMPEDANCE IN CMOS INPUT AND OUTPUT GAIN STAGES FOR A WIRELESS TRANSCEIVER

FIELD OF INVENTION

The present invention relates to input or output stages adjacent to an antenna or filter providing constant input and output impedances.

BACKGROUND OF THE INVENTION

The present invention is equally applicable to transmitters, receivers, and transceivers. It will find wide application in many environments. One such environment is the cell phone operating in the 900 MHz range but is applicable to all cell phone bands. It is necessary to regulate power transmitted by a cell phone to avoid interference with adjacent channels and comply with standards. One such standard is Mobile Station-Base Station Compatibility Standard for Dual-Mode Wide Band Spread Spectrum Cellular System, EIA/TIA Interim Standard IS-95, Telecommunications Industry Association, Washington, D.C., 1993.

Prior art circuits comprising RF signal circuit elements typically use multiple processing stages, including amplification of RF signal before the signal reaches the antenna where it is transmitted. In a typical transmitter of a direct conversion cell phone transceiver, normally comprises a digital to analog converter, a filtering stage and IQ (in-phase and quadrature) modulator, a filtering stage, a power amplifier, and another filter. Commonly, an automatic gain control function is applied to the final amplifier stage. Complex digital and analog circuitry in the cell phone regulate the strength of the transmitted signal and the receive signal level at the baseband processor.

Input and output impedances of the final amplifiers stage will vary. Output impedances of the modulator and the filter stage will vary. Variations in impedance can contribute to degraded signal to noise ratio and will cause various amounts of reflective power within the circuit. It is therefore desirable to provide a means and method for overcoming the aforesaid shortcomings. It is equally desirable to cure such shortcomings in input circuitry in the receiver's circuit.

SUMMARY OF THE INVENTION

It is therefore an object of the present invention to provide a stage in a transmitter or receiver operating in wireless frequency ranges performing a gain control function between a final or an initial stage respectively and process circuitry for adjusting gain and providing a constant input impedance at its input and a constant output impedance at its output.

It is a further, specific object of the present invention in one form to provide a direct conversion transceiver in which constant impedance gain control circuits are provided in the receive and transmit paths.

It is of further object of the present invention to provide input and output circuits of the type described which are simple in construction and efficient in operation.

Briefly stated, in accordance with the present invention, there is provided a constant resistance path is provided between the input and output of the constant impedance stage. The constant resistance preferably comprises first and second resistors of equal value. The source-drain circuit of a first CMOS transistor is connected across the resistive path. The source-drain circuit of a second CMOS transistor is connected between the junction of the first and second resistors and ground. The gate potential of the first CMOS transistor is controlled by a first digital to analog converter circuit, and the gate potential at the second CMOS transistor is controlled by the output of a second digital to analog converter. Gain, in the present case less than unity gain, is controlled by the level of conductivity of the source draining circuit of the second transistor. The harder the second transistor turns on, the lower the potential at the junction of the first and second resistors. This decrease in the resistance produces a decrease in circuit impedance which requires compensation. At the same time, the output voltage of the first digital to analog converter will decrease. Consequently, the source drain gate of the first transistor conducts less strongly and has a higher effective resistance. This higher effective resistance counteracts the impedance change caused by conduction by the second transmitter in response to a strong RF signal.

BRIEF DESCRIPTION OF THE DRAWINGS

The means by which the foregoing objects and features of the invention are achieved are pointed out with particularity in the claims forming the concluding portion of the specification. The invention, both as to its organization and manner of operation, may be further understood by reference to the following description taken in connection with the following drawings.

Of the drawings:

FIG. 4 is a block diagram illustrating alternative transmitter configurations.

DETAILED DESCRIPTION OF THE INVENTION

Figure 1:
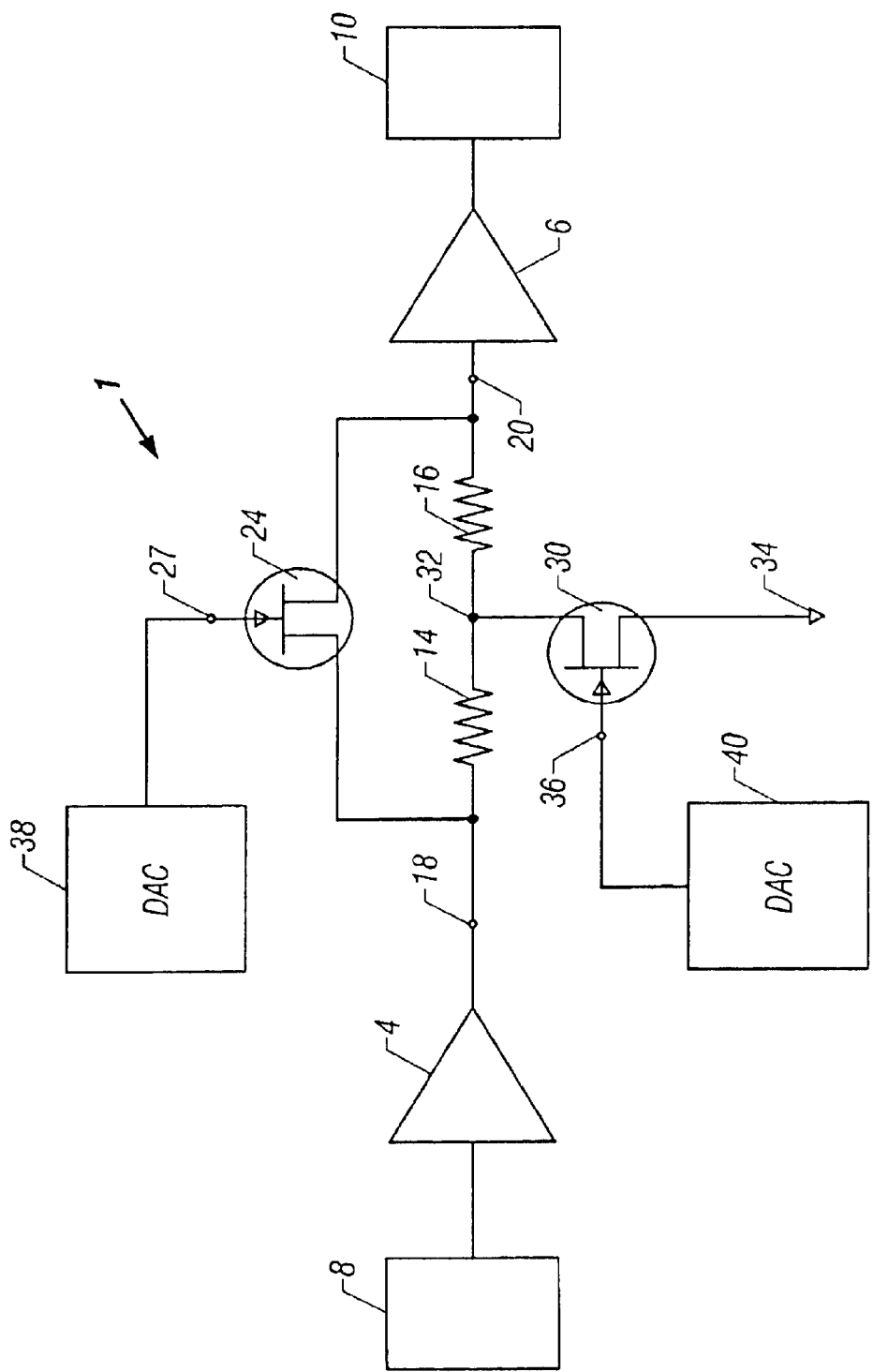
FIG. 1 is a partially block diagrammatic and partially schematic illustration of the present system suited for a wide variety of communication applications.

FIG. 1 is an illustration of a constant impedance gain control circuit 1 interacting in the environment of a communications circuit. For brevity, the constant impedance gain control circuit 1 will be called the gain control circuit 1. In the present example, gain will be a factor of less than unity. Thus the gain control circuit 1 could also be referred to as an attenuator. However, at certain levels of description, the labels applied to gain control circuits, attenuators, and filters can effectively be arbitrary. The gain control circuit 1 is connected between amplifiers 4 and 6 in a communications circuit. However, the input means 9 provides the signal which will be operated upon. FIG. 1 is thus illustrative of a transmitter or receiver. In particular illustration in FIG. 1, the transmitter option is illustrated by showing within the input means 9 a Gilbert cell modulator 7 which converts a signal to be transmitted into in-phase, and quadrature grid radio frequency signal. The radio frequency signal is up-converted by a mixer 8. In the case of a direct conversion receiver, the amplifier 4 and the amplifier 6 may each comprise a low noise amplifier. The amplifier 4 would be an input amplifier receiving an incoming radio frequency signal from an antenna comprising input means 8.

Where the gain control circuit 1 is used in a transmitter, the output stage 6 could comprise a power amplifier connected to output load 10. The output load 10 may comprise an antenna. In the case of a receiver, the amplifier 6 may comprise a second lower noise amplifier delivering an input to a Gilbert cell demodulator in the load means 10. It will be apparent what a final and an initial stage in the context of a given transmitter, receiver, or transceiver stage or other applicable stage will be. Various stages upstream and downstream of the gain control circuit 1 may comprise baseband filters, output filters, other attenuator stages. The circuits will normally be embodied on integrated circuit chips. To some degree, the actual characterization of particular blocks is arbitrary. However at some block diagrammatic level, there will indeed be an initial stage 4 and an output stage 6.

The gain control circuit 1 comprises four resistances (two fixed and two variable). First and second resistors 14 and 16 are connected in series between an input terminal 18 and output terminal 20 of the gain control circuit 1. A first n-channel CMOS transistor 24 (variable resistor) is provided with its source-drain circuit connected across the resistors 14 and 16 to the terminal 18 and 20. The gate of the transistor 24 is connected to a first control terminal 27. A second n-channel CMOS transistor 30; (acting as a variable resistor), is provided having its source-drain circuit connected between a junction 32 intermediate the transistor 14 and 16 and a level of reference potential such as ground 34. The transistor has a gate connected to a terminal 36, which is a second control terminal.

A first digital to analog converter 38 provides an input to the control terminal 27 of the gain control circuit 1 and a second digital to analog converter 40 provides a gain control signal to the second control terminal 36 of the gain control circuit 1. The digital to analog converters 38 and 40 receive signal information of the signal either being transmitted or received, derive information therefrom and produce a gain control signal, having a voltage (proportional) to gain, in a well-known manner.

Operation is first described in context of an example in which a signal level from the input amplifier 4 is too high. Greater attenuation by the gain control circuit 1 will be required compared to that provided for lower level signals. A signal proportional to the input signal is sent by the digital control circuit feeding the digital to analog converters 38 and 40. Gain control detection circuits are known in the art and will vary with the type of transmission or reception circuit used. A specific gain control circuit will be identified and discussed with respect to FIG. 2. Consequently, the detected signal level applied to digital to analog converter 40 causing the output to increase, reducing the internal resistance of the FET 30.

Increasing the voltage applied to the gate of the second transistor 30 increases the conductivity of its source-drain circuit. Consequently, the potential at terminal 32 intermediate resistors 14 and 16 is decreased, and a smaller radio frequency signal is provided at the output terminal 20. At the same time, the output voltage of the digital to analog converter 38 decreases. With a lower gate voltage at the transistor 24, the source drain circuit becomes less conductive. Consequently, resistance of the source drain circuit of transistor 24 increases. Resistance between the terminals 18 and 20 is increased. Consequently, decrease in impedance caused by greater conductivity of the transistor 30 is compensated for by increase to the impedance of the transistor 24. Consequently a constant input impedance is presented to the amplifier 4 by the gain control circuit 1. A constant output impedance is presented by the gain control circuit 1 to the amplifier 6. Additionally, the impedance is substantially entirely resistive and not reactive.

CMOS transistors 24 and 30 are preferred because the operate more as a voltage variable resistor. Bipolar transistors have temperature an linearity issues and operate more as a current sink.

Figure 2:
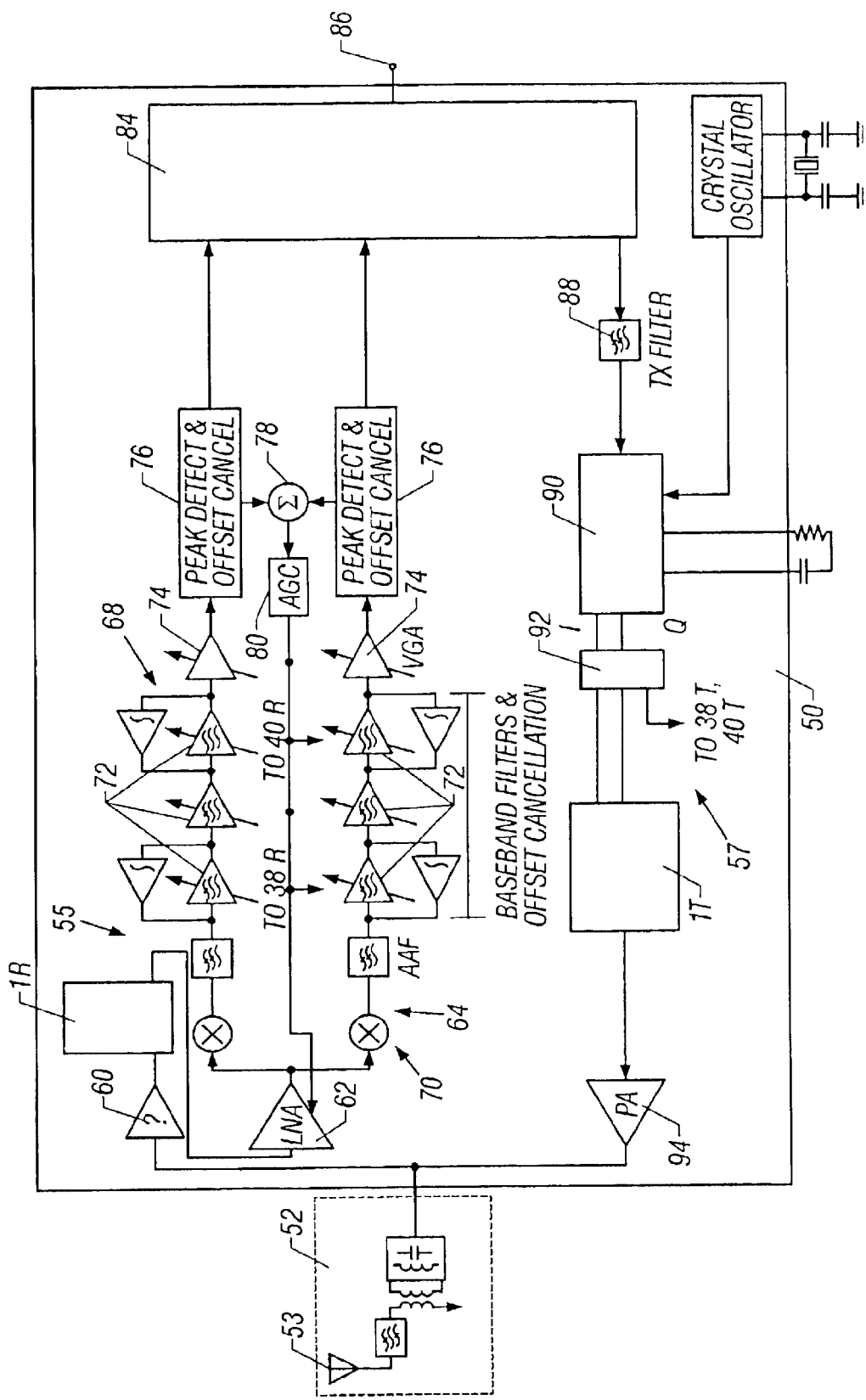
FIG. 2 is a partially schematic and partially block diagrammatic representation of the present invention as applied to a direct conversion transceiver.

FIG. 2 is a block diagrammatic representation of a direct conversion transceiver in which the gain control circuit 1 interacts. In FIG. 2, the same reference numerals are used to correspond to the same elements in FIG. 1. A transceiver 50 comprises an antenna interface circuit 52 including an antenna 53 coupled to a receiver 55 and transmitter 57. The antenna interface is coupled to a first low noise amplifier 60 and receiver 55. In many prior art embodiments, the amplifier 60 is a variable gain amplifier. In the present embodiment, the amplifier 60 is a fixed amplifier providing an input to a gain control circuit 1R. The suffix R indicates receiver. The gain control circuit 1R provides an input to a second, fixed low noise amplifier 62. The low noise amplifier 62 provides an input for a Gilbert cell demodulator 64 to provide both I&Q channels of voice or data. The Gilbert cell demodulator provides outputs on an I channel 68 and a Q channel 70. Each channel 68 and 70 includes conventional baseband filters and offset cancellation circuits 72. The filtering and offset cancellation circuits 72 are each coupled to a respective variable gain amplifier 74 which provides inputs to peak detection and offset cancellation circuits 76 feed to a summing circuit 78 providing input information to an automatic gain control circuit 80.

The automatic gain control circuit 80 provides inputs to the DACS 38R and 40R (FIG. 1), the suffix capital R again standing for receiver, which provide the control inputs to the gain circuit 1R. Outputs of the I channel 68 and 70 are provided to a processing system 84 providing data and/or voice information at an output terminal 86. Similarly, information to be transmitted is provided to an input terminal 88 to the process circuit 84.

Digital information to be transmitted from the processing system 84 is filtered by a transmission filter 88 and modulated by a Gilbert cell modulator 90. Conventional filtering circuitry 92 filters the I&Q output terminals and provides these signals to be transmitted to the gain control circuit 1T, the suffix T designating transmitter. Outputs from the gain control circuit 1T are delivered to a power amplifier 94. In prior art embodiments, the power amplifier 94 would normally be a variable gain amplifier. In the present invention, the output power amplifier 94 is a fixed amplifier, and gain control is provided in gain circuit 1T. The output of the power amplifier 94 is coupled to the antenna interface circuit 52 for transmission by the antenna 53. Again, the gain control circuit 1T is controlled by digital analog converter circuits 38T and 40T which receive inputs from a gain control circuit.

Figure 3:
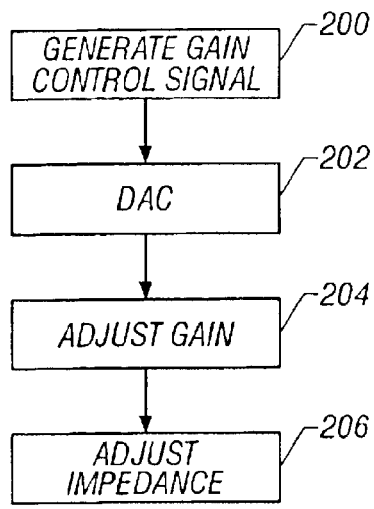
FIG. 3 is a block diagram illustrating the method of the present invention.

FIG. 3 illustrates the method of the present invention. At block 200, the gain control signal is generated for the signal path in question. At block 202, proportioning of the gain control signal is provided to provide the proper input to the digital to analog converters 38 and 40 the proportion is set during initial calibration. Blocks 204 and 206 illustrative serially solely for purposes of illustration. They will be performed substantially simultaneously. At block 204, gain is adjusted to vary inversely with the magnitude of a sampled radio frequency signal. Finally, at block 206, impedance of the circuit 1 is adjusted to compensate for impedance change caused by the gain adjustment at block 204.

Figure 4A:
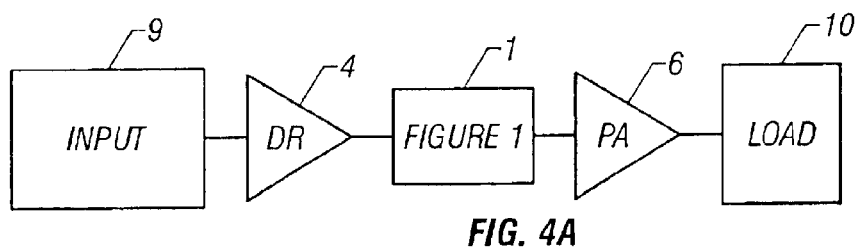
FIGS. 4A, 4B and 4C are each a block diagram illustrating nominal configurations for an apparatus constructed in accordance with the present invention.
Figure 4B:
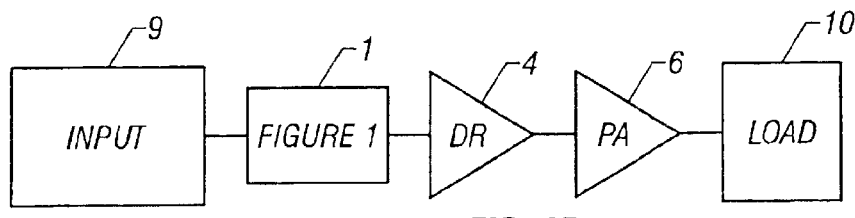
Figure 4C:
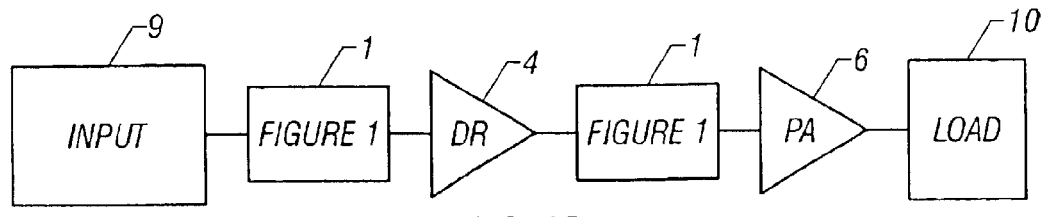

FIG. 4 illustrates three examples of where the apparatus could be used in a transmission path. FIGS. 4A, 4B and 4C are block diagrammatic illustrations of a constant impedance gain control circuit 1 in either a transmitter or receiver. The particular context of a transmitter is discussed. However, with respect to FIG. 1, the context of a receiver is readily substitutable. In the embodiment of FIG. 4A, the input means 9 provides a signal to the amplifier 4 which is followed by the constant impedance gain control circuit 1 providing an output to the amplifier 6. It is not necessary that the constant impedance gain control circuit 1 be connected to the output of amplifier 4. As illustrated in FIG. 4B, the constant impedance gain control circuit 1 may be coupled to the input means 9 and provide an output to the amplifier 4 in order to supply the signal being received at the amplifier 6. FIG. 4C illustrates an embodiment particularly suited for a wide dynamic range transmitter such as might be found in a wide band code division multiplex access (WCDMA) transmitter. A first impedance gain control circuit 1 is connected to the output of the input means 9 as in FIG. 4B to provide an input to the amplifier 4. However, in order to provide greater dynamic range, a second constant impedance gain control circuit one—is connected between the amplifiers 4 and 6. Many other possible configurations will be apparent to those skilled in the art.

What are thus provided are an apparatus and method for providing simplified; efficient gain control in a wireless transceiver, wireless data transmission, or other communications circuits. The specification will enable those skilled in the art to make many departures from the specific example herein to provide a gain circuit for a communication circuit in accordance with the present invention.

What is claimed is:

1. A gain control circuit in a radio frequency transmission path for an amplifier stage adjacent an antenna and having an input terminal, an output terminal and first and second control terminals comprising:

a fixed resistance connected between said input terminal and said output terminal;

a first semiconductive circuit connected between said fixed resistance and a level of reference potential, and a second semiconductive circuit connected across said fixed resistance, a control terminal of said first semiconductive circuit for connection to a gain control signal for decreasing resistance of said first semiconductive circuit in response to increase of the radio frequency signal, and a control terminal of the second semi-conductive circuit connected to a complimentary gain control signal for having its resistance raised and increasing impedance of said gain control circuit in correspondence with a decrease of impedance said first semiconductive circuit.

2. The gain circuit of claim 1 where an said first and second semi-conductive circuits comprise source-drain circuits of first and second CMOS transistors respectively, and said control terminal of each said semiconductive circuit comprises a gate electrode.

3. The circuit according to claim 2 wherein said resistance comprises first and second resistors and said first semiconductive circuit is connected to a terminal intermediate said first and second resistors.

4. The circuit of claim 3 wherein said first and second resistors are of equal value.

5. An output signal path and a transmitter comprising a gain control circuit according to claim 4, a modulation stage output connected to the input terminal of said gain control circuit and a final stage power amplifier coupled between said output terminal of said gain control circuit and an antenna.

6. A receiver input circuit comprising a gain circuit according to claim 4, an input fixed amplifier coupled between an antenna and said input terminal and said gain circuit and an amplifier connected between said output terminal of said gain circuit and an input to a demodulation stage.

7. In a direct conversion wireless communication transceiver having an input stage and an output stage, said input and output stages respectively comprising amplifiers adjacent an antenna, the improvement wherein said receiver comprises a fixed gain input amplifier coupled to a gain circuit according to claim 4.

8. The improvement according to claim 7 wherein said output stage comprises a fixed gain amplifier coupled to an antenna and a gain circuit according to claim 4 providing an input to said power amplifier.

9. In a direct conversion transceiver comprising an input stage and an output stage the improvement wherein said output stage comprises a fixed power amplifier connected to coupled to an antenna and a gain circuit according to claim 4 in providing an input in to said power amplifier circuit.

10. A method for controlling gain and providing a constant impedance in a signal path comprising measuring a radio frequency signal to produce a gain control signal;

proportioning said gain control signal into first and second components, to provide first and second gain control signals;

adjusting gain of said signal path in accordance with said first control signal;

and changing the impedance of said signal path in accordance with impedance change provided by said gain adjustment.

11. The method of claim 10 comprising providing first and second fixed resistances connected between an input terminal and an output terminal of the gain control circuit, wherein adjusting gain comprises varying conductivity of a source-drain circuit connected between a terminal intermediate said first and second resistors and ground inversely with magnitude of the measured radio frequency signal, and wherein adjusting impedance comprises increasing resistance of a source-drain circuit connected across the first and second resistors.

* * * * *